(12) United States Patent
Yoshioka et al.

(10) Patent No.: US 8,698,003 B2
(45) Date of Patent: *Apr. 15, 2014

(54) METHOD OF PRODUCING CIRCUIT BOARD, AND CIRCUIT BOARD OBTAINED USING THE MANUFACTURING METHOD

(75) Inventors: Shingo Yoshioka, Osaka (JP); Hiroaki Fujiwara, Ikoma (JP)

(73) Assignee: Panasonic Corporation, Osaka (JP)

( * ) Notice: Subject to any disclaimer, the term of this patent is extended or adjusted under 35 U.S.C. 154(b) by 410 days.

This patent is subject to a terminal disclaimer.

(21) Appl. No.: 13/131,402

(22) PCT Filed: Nov. 30, 2009

(86) PCT No.: PCT/JP2009/070106
§ 371 (c)(1),
(2), (4) Date: May 26, 2011

(87) PCT Pub. No.: WO2010/064602
PCT Pub. Date: Jun. 10, 2010

(65) Prior Publication Data
US 2011/0247860 A1  Oct. 13, 2011

Related U.S. Application Data

(63) Continuation-in-part of application No. 12/326,169, filed on Dec. 2, 2008, now Pat. No. 8,240,036.

(30) Foreign Application Priority Data

Oct. 30, 2009  (JP) ................................ 2009-251269

(51) Int. Cl.
*H05K 1/03* (2006.01)
(52) U.S. Cl.
USPC ........... 174/255; 174/250; 174/251; 174/262; 29/829; 29/830; 29/831; 29/832; 29/846

(58) Field of Classification Search
USPC ............ 174/255, 250, 251, 262; 29/829–832, 29/846
See application file for complete search history.

(56) References Cited

U.S. PATENT DOCUMENTS

| 4,808,360 | A | 2/1989 | Natori et al. |
| 4,820,762 | A | 4/1989 | Tsaur |

(Continued)

FOREIGN PATENT DOCUMENTS

| DE | 19645854 | 5/1998 |
| EP | 0260514 | 3/1988 |

(Continued)

OTHER PUBLICATIONS

Korea Office action that issued with respect to patent family member Korean Patent Application No. 10-2010-7021142, mail date is Oct. 14, 2011.

(Continued)

*Primary Examiner* — Xiaoliang Chen
(74) *Attorney, Agent, or Firm* — Greenblum & Bernstein, P.L.C.

(57) ABSTRACT

One aspect of the present invention resides in a method of producing a circuit board, including a film-forming step of forming a resin film on a surface of an insulative substrate; a circuit pattern-forming step of forming a circuit pattern portion by forming a recessed portion having a depth equal to or greater than a thickness of the resin film, with an outer surface of the resin film serving as a reference; a catalyst-depositing step of depositing a plating catalyst or a precursor thereof on a surface of the circuit pattern portion and a surface of the resin film; a film-separating step of removing the resin film from the insulative substrate; and a plating step of forming an electroless plating film only in a region where the plating catalyst or the precursor thereof remains after the resin film is separated.

20 Claims, 6 Drawing Sheets

(56) References Cited

U.S. PATENT DOCUMENTS

| | | | |
|---|---|---|---|
| 5,041,356 | A | 8/1991 | Takeda et al. |
| 5,266,446 | A | 11/1993 | Chang et al. |
| 5,792,595 | A | 8/1998 | Takayanagi et al. |
| 6,004,619 | A | 12/1999 | Dippon et al. |
| 6,184,479 | B1 | 2/2001 | Okabe et al. |
| 6,413,687 | B1 | 7/2002 | Hattori et al. |
| 6,448,504 | B1 | 9/2002 | Taguchi |
| 6,640,434 | B1 | 11/2003 | Wojewnik et al. |
| 8,240,036 | B2 * | 8/2012 | Yoshioka et al. ............ 29/846 |
| 8,272,126 | B2 * | 9/2012 | Yoshioka et al. ............ 29/846 |
| 2002/0117400 | A1 | 8/2002 | Hotta et al. |
| 2003/0148904 | A1 | 8/2003 | Moore |
| 2004/0197487 | A1 | 10/2004 | Aoki et al. |
| 2005/0163919 | A1 | 7/2005 | Murata |
| 2006/0055021 | A1 | 3/2006 | Yamamoto |
| 2006/0165877 | A1 | 7/2006 | Yanagimoto et al. |
| 2007/0218192 | A1 | 9/2007 | Kimura et al. |
| 2008/0008824 | A1 | 1/2008 | Cho et al. |
| 2009/0272562 | A1 * | 11/2009 | Yoshioka et al. ............ 174/250 |
| 2009/0272564 | A1 * | 11/2009 | Yoshioka et al. ............ 174/255 |
| 2010/0044087 | A1 | 2/2010 | Fukuhara et al. |
| 2010/0218982 | A1 | 9/2010 | Fujiwara et al. |
| 2010/0263921 | A1 | 10/2010 | Nakahara et al. |
| 2012/0285736 | A1 * | 11/2012 | Yoshioka et al. ............ 174/262 |
| 2012/0292083 | A1 * | 11/2012 | Yoshioka et al. ............ 174/251 |

FOREIGN PATENT DOCUMENTS

| | | |
|---|---|---|
| EP | 0817549 | 1/1998 |
| JP | 57-134996 | 8/1982 |
| JP | 58-186994 | 11/1983 |
| JP | 63-183445 | 7/1988 |
| JP | 2-68988 | 3/1990 |
| JP | 7-281437 | 10/1995 |
| JP | 7-509322 | 10/1995 |
| JP | 10-78654 | 3/1998 |
| JP | 10-078654 | 3/1998 |
| JP | 10-233562 | 9/1998 |
| JP | 11-212262 | 8/1999 |
| JP | 2000-231190 | 8/2000 |
| JP | 2000-236149 | 8/2000 |
| JP | 2001-201851 | 7/2001 |
| JP | 2001-251042 | 9/2001 |
| JP | 2002-252445 | 9/2002 |
| JP | 2002-361475 | 12/2002 |
| JP | 2003-46243 | 2/2003 |
| JP | 2003-264359 | 9/2003 |
| JP | 2003-273484 | 9/2003 |
| JP | 2003-309346 | 10/2003 |
| JP | 2004-48030 | 2/2004 |
| JP | 2004-048030 | 2/2004 |
| JP | 2004-281427 | 10/2004 |
| JP | 2007-088288 | 4/2007 |
| JP | 2008-22002 | 1/2008 |
| JP | 2008-022002 | 1/2008 |
| JP | 2008-058710 | 3/2008 |
| WO | 94/01985 | 1/1994 |
| WO | 2005/104638 | 11/2005 |

OTHER PUBLICATIONS

Extended European Search Report issued in respect to EP Patent Application No. 13000238.9, dated Apr. 15, 2013.

European Office Action issued with respect to European Application No. 12001246.3, dated Apr. 18, 2013.

Japan Office Action that issued with respect to patent family member Japanese Patent Application No. 2009-104086, mail date is May 22, 2012.

International Search Report that issued with respect to patent family member International Patent Application No. PCT/JP2009/070106, mail date is Jan. 26, 2010.

International Search Report that issued with respect to patent family member International Patent Application No. PCT/JP2010/006378, mail date is Jan. 11, 2011.

Partial European Search Report that issued with respect to patent family member European Patent Application No. 12001246.3, mail date is May 15, 2012.

European Search Report that issued with respect to patent family member European Patent Application No. 09830368 8, mail date is May 24, 2012.

Korean Office Action issued with respect to related Korean Application No. 2010-7021143, dated Jun. 11, 2012 with translation.

U.S.A. Office action that issued with respect to patent family member U.S. Appl. No. 12/431,950, mail date is Apr. 12, 2012.

Korea Office action that issued with respect to Patent family member Korean Patent Application No. 11-2011-7029869, mail date is Jan. 10, 2012.

Korea Office action that issued with respect to Patent family member Korean Patent Application No. 11-2011-7029871, mail date is Jan. 10, 2012.

Korea Office action that issued with respect to Patent family member Korean Patent Application No. 11-2011-7029872, mail date is Jan. 10, 2012.

European Office Action issued with respect to counterpart European Application No. 09 830 368.8, dated Dec. 13, 2012.

* cited by examiner

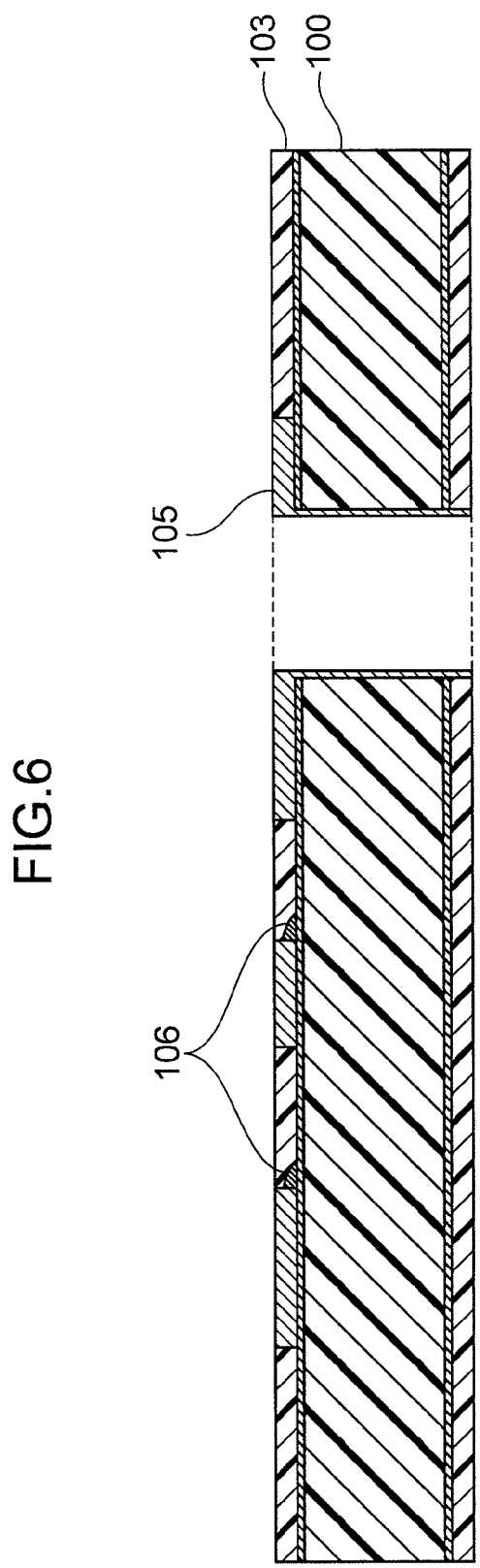

METHOD OF PRODUCING CIRCUIT BOARD, AND CIRCUIT BOARD OBTAINED USING THE MANUFACTURING METHOD

This application is a National Stage Application of International Application No. PCT/JP2009/070106, filed Nov. 30, 2009, which is a continuation-in-part of U.S. application Ser. No. 12/326,169, filed on Dec. 2, 2008, and claims priority to Japanese Application No. 2009-251269, filed Oct. 30, 2009, the disclosures of which are expressly incorporated herein by reference in their entireties.

TECHNICAL FIELD

The present invention relates to a method of producing a circuit board and to a circuit board obtained using the manufacturing method.

BACKGROUND ART

The level of functionality of electric devices such as portable information terminal devices such as cellular phones, computers and peripheral equipment thereof, and various home information products has been rapidly increasing. Accordingly, circuit boards that are carried in such electric devices are required to have an even higher density of electric circuits. Methods that can form accurately the wiring of electric circuits that is decreased in line width and line spacing (width of portions between the adjacent electric circuits) are needed to meet such a demand for increased density of circuits. In circuit wirings of increased density, short circuiting or migration between the wirings can easily occur.

A method for forming an electric circuit on an insulative substrate by a subtractive method or an additive method is known as a method of producing a circuit board. With the subtractive process, an electric circuit is formed by removing (subtractive) a metal foil outside a portion where an electric circuit is wished to be formed on the surface of a metal foil stretched laminate. With the additive processes, an electric circuit is formed by conducting electroless plating only on the portion where a circuit is wished to be formed on an insulative substrate.

In the subtractive method, the metal foil is left only in the portion where the electric circuit is wished to be formed (circuit formation portion) and removed from other portions by etching the thick-film metal foil. With such a method, the metal from the removed portions is wasted and therefore the production cost is disadvantageously high. With the additive method, metal wiring can be formed by electroless plating only on the portions where the electric circuit is wished to be formed. Therefore, no metal is wasted and natural resources can be saved. These reasons also make the additive method an advantageous circuit formation method.

A method for forming an electric circuit including metal wirings by a full additive method, which is one of the typical conventional additive methods, will be described below with reference to FIGS. 5A to 5E. FIGS. 5A to 5E are schematic cross-sectional views illustrating steps of forming a metal wiring by the conventional full additive method.

First, as shown in FIG. 5A, a plating catalyst 102 is deposited to the surface of an insulative substrate 100 having a through hole 101 formed therein. The surface of the insulative substrate 100 has been roughened in advance. Then, as shown in FIG. 5B, a photoresist layer 103 is formed on the insulative substrate 100 to which the plating catalyst 102 has been deposited. Then, as shown in FIG. 5C, the photoresist layer 103 is exposed via a photomask 110 in which a predetermined circuit pattern has been formed. Then, as shown in FIG. 5D, the exposed photoresist layer 103 is developed and a circuit pattern 104 is formed. Then, as shown in FIG. 5E, a metal wiring 105 is formed by performing electroless plating such as electroless copper plating on the surface of the circuit pattern 104 that has been formed by development and the inner wall surface of the through hole 101. By performing the abovementioned steps, a circuit including the metal wiring 105 is formed on the insulative substrate 100.

In the above-described conventional additive method, the plating catalyst 102 is deposited to the entire surface of the insulative substrate 100. As a result, the following problem is encountered. Thus, when the photoresist layer 103 is developed with high accuracy, a plating film can be formed only on the portion that is not protected by the photoresist. However, when the photoresist layer 103 is not developed with high accuracy, an unnecessary plating portion 106 sometimes remains on the portion where the plating film is not wished to be formed, as shown in FIG. 6. Such a result is due to the deposit of the plating catalyst 102 to the entire surface of the insulative substrate 100. The unnecessary plating portion 106 causes short circuiting or migration between the adjacent circuits. Such short circuiting or migration easier occurs when a circuit with small line width and line spacing is formed. FIG. 6 is a schematic cross-sectional view illustrating the contour shape of the circuit formed by the conventional full additive method.

Examples of manufacturing methods that differ from the above-described method of producing a circuit substrate are described in Patent Document 1 and Patent Document 2.

Patent Document 1 discloses the following method as another additive method.

First, a solvent-soluble first photosensitive resin layer and an alkali-soluble second photosensitive resin layer are formed on an insulating substrate (insulating base material). Then, the first and second photosensitive resin layers are exposed via a photomask having a predetermined circuit pattern. Then, the first and second photosensitive resin layers are developed. A catalyst is then caused to be adsorbed by the entire surface including the recess formed by the development, and then only the unnecessary catalyst is removed by dissolving the alkali-soluble second photosensitive resin layer with an alkali solution. A circuit is then accurately formed by electroless plating only on the portion where the catalyst is present.

Patent Document 2 discloses the following method.

First, a resin protective film is coated on an insulative substrate (insulating base material) (first step). Then, a groove and a through hole corresponding to a wiring pattern are individually or simultaneously delineated and formed by mechanical processing or laser beam irradiation on the insulating substrate coated with the protective film (second step). An activation layer is then formed over the entire surface of the insulating substrate (third step). The protective film is then peeled off, the activation layer present on the insulating substrate is removed, and the activation layer is left only on the inner wall surface of the groove and through hole (fourth step). The insulating substrate is then plated without using a plating protective film and an electrically conductive layer is selectively formed only on the inner wall surface of the activated groove and through hole (fifth step).

Patent Document 2 also indicates that a thermosetting resin is coated as the protective film on the insulating substrate and thermally cured and then the protective film and the insulating substrate are machined according to the predetermined wiring pattern and that the thermosetting resin present on the surface of the insulating substrate is removed with a solvent (Patent Document 2, second page, lower left column, line 16 to lower right column, line 11).

Patent Document 1: Japanese Patent Application Publication No. S57-134996

Patent Document 2: Japanese Patent Application Publication No. S58-186994

SUMMARY OF THE INVENTION

It is an object of the present invention to provide a method of producing a circuit substrate that makes it possible to form a high-precision electric circuit on an insulative substrate in an easy manner.

One aspect of the present invention resides in a method of producing a circuit board according to the present embodiment, including: a film-forming step of forming a resin film on a surface of an insulative substrate; a circuit pattern-forming step of forming a circuit pattern portion by forming a recessed portion having a depth equal to or greater than a thickness of the resin film, with an outer surface of the resin film serving as a reference; a catalyst-depositing step of depositing a plating catalyst or a precursor thereof on a surface of the circuit pattern portion and a surface of the resin film; a film-separating step of removing the resin film from the insulative substrate; and a plating step of forming an electroless plating film only in a region where the plating catalyst or the precursor thereof remains after the resin film is separated.

Other objects, features, aspects, and advantages of the present invention will become apparent from the following detailed description and the appended drawings.

BRIEF DESCRIPTION OF THE DRAWINGS

FIG. 6 is a schematic cross-sectional view illustrating the contour shape of the circuit formed by the conventional full additive method.

BEST MODE FOR CARRYING OUT THE INVENTION

Figure 1A:
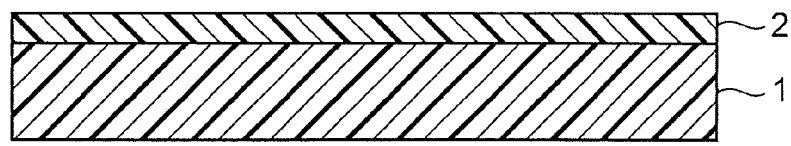
FIGS. 1A to 1E are schematic cross-sectional views for explaining each step of the method of producing a circuit board according to the first embodiment.

The investigation conducted by the inventors demonstrates that the method described in Patent Document 1 involves very complex manufacturing steps because it is necessary to form photosensitive resin layers of two kinds that differ in solvent solubility, perform development with two solvents at the development stage, cause the adsorption of a catalyst, and then dissolve the second photosensitive resin with an alkali solution.

Patent Document 2 includes no specific description of the type of thermosetting resin used as the protective layer. According to the investigation conducted by the inventors, the problem associated with typical thermosetting resins is that they excel in solvent resistance and are unlikely to be removed with a simple solvent. Further, such thermosetting resins demonstrate very high adhesion to the resin base material and it is difficult to remove accurately only the protective film, without leaving pieces of the protective film on the surface of the resin base material. Further, when a strong solvent is used or dipping is performed for a long time to ensure sufficient peeling, the plating catalyst present on the base material surface is also removed. In this case, an electrically conductive layer is not formed on the portions from which the plating catalyst has been removed. In addition, when a strong solvent is used or dipping is performed for a long time, the protective film composed of the thermosetting resin cracks and comes apart and the plating catalyst contained in the protective film is dispersed again in the solvent. The plating catalyst that has thus been dispersed again in the solvent can adhere again to the resin base material surface and an unnecessary plating film can be formed on the respective portions. Therefore, with a method such as the method disclosed in Patent Document 2, it is difficult to form a circuit having an accurate contour.

The present invention has been created on the basis of results of the abovementioned investigation. Embodiments of the present invention will be described below in greater detail.

First Embodiment

The method of producing a circuit board according to the present embodiment includes a film-forming step of forming a resin film on a surface of an insulative substrate; a circuit pattern-forming step of forming a circuit pattern portion by forming a recessed portion having a depth equal to or greater than a thickness of the resin film, with an outer surface of the resin film serving as a reference; a catalyst-depositing step of depositing a plating catalyst or a precursor thereof on a surface of the circuit pattern portion and a surface of the resin film; a film-separating step of removing the resin film from the insulative substrate; and a plating step of forming an electroless plating film only in a region where the plating catalyst or the precursor thereof remains after the resin film is separated.

First, the method of producing a circuit board according to the first embodiment of the present invention will be described. FIGS. 1A to 1E are schematic cross-sectional views for explaining each step of the method of producing a circuit board according to the first embodiment.

Initially, as shown in FIG. 1A, a resin film 2 is formed on the surface of an insulative substrate 1. This step corresponds to the film-forming step.

Figure 1B:
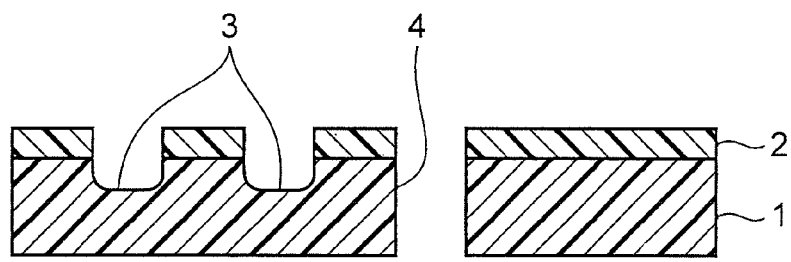

Then, as shown in FIG. 1B, a circuit pattern portion is formed by forming a recessed portion having a depth equal to or greater than a thickness of the resin film 2, with the outer surface of the resin film 2 serving as a reference. The circuit pattern portion may be a recessed portion formed in the resin film 2 so as to reach the front surface of the insulative substrate 1 or may be a circuit groove 3 obtained by performing engraving on the insulative substrate 1. If necessary, the insulative substrate 1 may be drilled for forming a through hole 4 as part of the circuit groove 3. A portion where an electroless plating film is formed by electroless plating, that is, a portion where an electric circuit is formed, is determined by the circuit groove 3. This step corresponds to the circuit pattern-forming step. The explanation below will be focused on the circuit groove 3 as the circuit pattern portion.

Figure 1C:
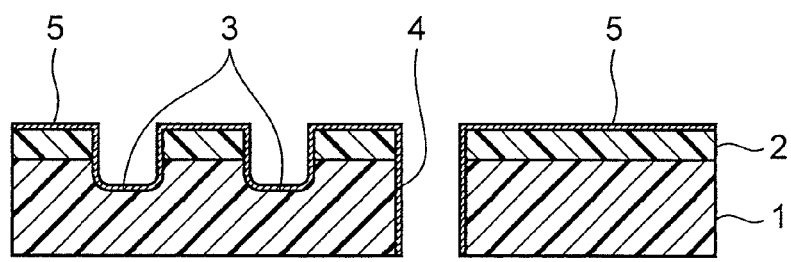

Then, as shown in FIG. 1C, a plating catalyst 5 or a precursor thereof is deposited to the surface of the circuit groove 3 and the surface of the resin film 2 where the circuit groove 3 has not been formed. This step corresponds to the catalyst-depositing step.

Figure 1D:
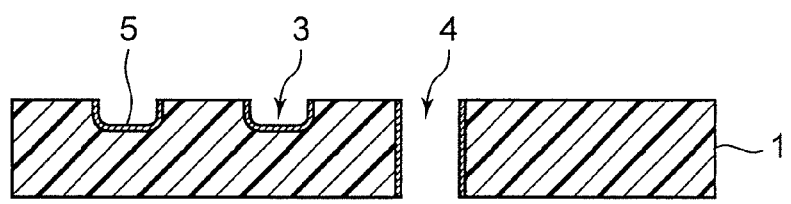

Then, as shown in FIG. 1D, the resin film 2 is separated from the insulative substrate 1. As a result, it is possible to leave the plating catalyst 5 or the precursor thereof only on the surface of the portion of the insulative substrate 1 where the circuit groove 3 has been formed. However, the plating catalyst 5 or the precursor thereof that has been deposited to the surface of the resin film 2 is removed together with the resin film 2 in a state of being carried on the resin film 2. This step corresponds to the film-separating step.

Figure 1E:
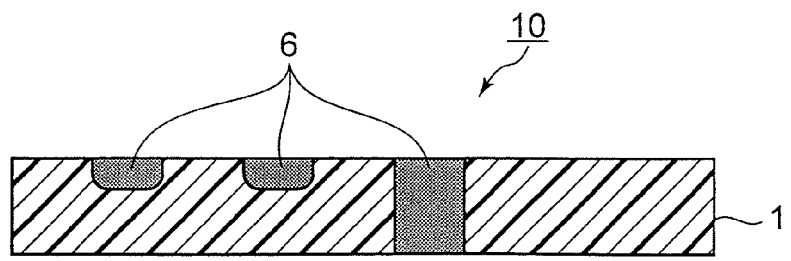

Then, the insulative substrate 1 from which the resin film 2 has been separated is electroless plated. As a result, the electroless plating film is formed on the portion where the plating catalyst 5 or the precursor thereof remains. Thus, as shown in FIG. 1E, the electroless plating film serving as an electric circuit 6 is formed on the portion where the circuit groove 3 has been formed. The electric circuit 6 may be constituted by the electroless plating film or the thickness thereof may be further increased by further performing electroless plating (fill-up plating) on the electroless plating film. More specifically, for example, as shown in FIG. 1E, the electric circuit 6 constituted by the electroless plating film may be formed so as to be embedded in the entire circuit groove 3 or the through hole 4 so that no step is present between the insulative substrate 1 and the electric circuit. This step corresponds to the plating step.

A circuit board 10 such as shown in FIG. 1E is formed by the above-mentioned steps. In the circuit board 10 thus formed, the aforementioned electric circuit 6 is formed on the insulative substrate 1 with high accuracy.

Each feature of the present embodiment will be explained below.

<Film-Forming Step>

The film-forming step is a step in which the resin film 2 is formed on the surface of the insulative substrate 1 as described hereinabove.

(Insulative Substrate)

The insulative substrate 1 used in the film-forming step is not particularly limited, provided that the insulative substrate can be used to manufacture the circuit board. Suitable examples include resin base materials including a resin.

Circuit boards, for example, various organic boards that can be used for producing multilayer circuit boards, can be used without any limitation as the resin base materials. Specific examples of organic boards include boards composed of an epoxy resin, an acrylic resin, a polycarbonate resin, a polyimide resin, a polyphenylene sulfide resin, a polyphenylene ether resin, a cyanate resin, a benzoxazine resin, and a bis-maleimide resin that have been conventionally used for producing multilayer circuit boards.

The epoxy resin is not particularly limited, provided that the epoxy resin can constitute organic boards of various types that can be used for producing a circuit board. Specific examples include a bisphenol A epoxy resin, a bisphenol F epoxy resin, a bisphenol S epoxy resin, an aralkyl epoxy resin, a phenol novolac epoxy resin, an alkylphenol novolac epoxy resin, a biphenol epoxy resin, a naphthalene epoxy resin, a dicyclopentadiene epoxy resin, an epoxy compound of a condensate of phenol and an aromatic aldehyde having a phenolic hydroxyl group, triglycidylisocyanate, and an alicyclic epoxy resin. In order to impart flame resistance, the aforementioned epoxy resins modified with bromine or phosphorus, nitrogen-containing resins, and silicon-containing resins can be also used. The aforementioned epoxy resins and resin may be used individually or in combinations of two or more thereof.

When the base material is made of the abovementioned resins, a curing agent is typically introduced for performing curing. The curing agent is not particularly limited, provided that it can be used as a curing agent. Specific examples include dicyandiamide, a phenolic curing agent, an acid anhydride curing agent, an aminotriazine novolac curing agent, and a cyanate resin. Examples of suitable phenolic curing agents include a novolac phenolic curing agent, an aralkylphenolic curing agent, and a terpene phenolic curing agent. A phenolic resin modified with phosphorus to impart flame resistance or a phosphorus-modified cyanate resin can be also used. The aforementioned curing agents may be used individually or in combinations of two or more thereof.

Since the circuit pattern is formed by laser processing, it is preferred that a resin be used that demonstrates good absorption of laser radiation in a wavelength range of 100 nm to 400 nm, but this condition is not particularly limiting. A polyamide resin is a specific example of suitable resin.

The insulative substrate (insulating layer) may include a filler. The filler may be in the form of fine inorganic particles or fine organic particles and the type of particles is not particularly limiting. Where a filter is contained, the filler is exposed in the laser processed portion and the adhesion of the plated film and resin is improved by peaks and valleys present on the filler.

Specific examples of materials constituting the fine inorganic particles include filling materials with a high dielectric constant such as aluminum oxide ($Al_2O_3$), magnesium oxide (MgO), boron nitride (BN), aluminum nitride (AlN), silica ($SiO_2$), barium titanate ($BaTiO_3$), and titanium oxide ($TiO_2$); magnetic filling materials such as hard ferrites; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salts, zinc borate, molybdenum compounds, and zinc stannate; talc ($Mg_3(Si_4O_{10})(OH)_2$), barium sulfate ($BaSO_4$), calcium carbonate ($CaCO_3$), and mica. The aforementioned types of fine inorganic particles may be used individually or in combinations of two or more thereof. Since these fine inorganic particles enable a high degree of freedom in selecting thermal conductivity, relative permittivity, flame retardation ability, particle size distribution, and color tone, when the desired functions are to be selectively imparted, highly efficient filling can be easily performed by designing the particle size and compounding the particles as appropriate. It is preferred that a filler with an average particle size equal to or less than the thickness of the insulating layer be used, and a filler with an average particle size of 0.01 μm to 10 μm, more preferably 0.05 μm to 5 μm be used, but these ranges are not particularly limiting.

In order to improve dispersivity of the fine inorganic particles in the insulative substrate, the particle surface may be treated with a silane coupling agent. Further, in order to improve dispersivity of the fine inorganic particles in the insulative substrate, the insulative substrate may include a silane coupling agent. The silane coupling agent is not particularly limited. Suitable examples of silane coupling agents include epoxysilane agents, mercaptosilane agents, aminosilane agents, vinylsilane agents, styrylsilane agents, methacryloxysilane agents, acryloxysilane agents, and titanate agents. The aforementioned silane coupling agents may be used individually or in combinations of two or more thereof.

Further, in order to improve dispersivity of the fine inorganic particles in the insulative substrate, the insulative substrate may include a dispersant. The dispersant is not particularly limited. Specific examples of suitable dispersants include alkyl ether dispersants, sorbitan ester dispersants, alkylpolyetheramine dispersant, and polymer dispersants. The aforementioned dispersants may be used individually or in combination of two or more thereof.

(Resin Film)

The resin film 2 is not particularly limited, provided that the resin film can be separated in the film-separating process. More specifically, a soluble resin such that can be easily dissolved with an organic solvent or an alkali solution or a swellable resin film composed of a resin that can be swelled by the below-described predetermined liquid (swelling liquid). Among these resins, a swellable resin film is especially preferred since such a film can be accurately separated in an easy manner. Further, it is preferred that the swellable resin film have a swelling degree with respect to the abovementioned liquid (swelling liquid) of, for example, equal to or greater than 50%. The aforementioned swellable resin films include not only resin films that are substantially not soluble in the liquid (swelling liquid) and can be easily peeled off from the surface of the insulative substrate 1 by swelling, but also resin films that are swellable by the liquid (swelling liquid) and at least partially soluble therein and can be easily peeled off from the surface of the insulative substrate 1 by swelling or dissolution and resin films that are soluble in the liquid (swelling liquid) and can be easily peeled off from the surface of the insulative substrate 1 by dissolution.

A method for forming the resin film 2 is not particularly limited. Examples of specific suitable methods include a method of coating a liquid material that can form a resin film on the surface of the insulative substrate 1 and then performing drying and a method of coating the liquid material on a support substrate, then performing drying to form a resin film, and transferring the resin film to the surface of the insulative substrate 1. The method for coating the liquid material is not particularly limited. Specific examples of suitable methods include the conventional spin coating method and bar coating method.

The thickness of the resin film 2 is preferably equal to or less than 10 μm, more preferably equal to or less than 5 μm. Further, the thickness of the resin film 2 is preferably equal to or greater than 0.1 μm, more preferably equal to or greater than 1 μm. Where the thickness of the resin film 2 is too large, the accuracy of the circuit pattern portions such as a circuit groove or a through hole that are formed by laser processing or machining in the circuit pattern-forming step tends to decrease. Where the thickness of the resin film 2 is too small, a resin film of uniform thickness is difficult to form.

A swellable resin film that is advantageous as the resin film 2 will be explained below by way of example.

A resin film with a swelling degree equal to or greater than 50% with respect to a swelling liquid can be advantageously used as the swellable resin film. A resin film with a swelling degree equal to or greater than 100% with respect to a swelling liquid is more preferred. Where the swelling degree is too low, the swellable resin film is difficult to peel off in the film-separating step.

The method for forming the swellable resin film is not particularly limited, and methods similar to the above-described methods for forming the resin film 2 may be used. Examples of specific suitable methods include a method of coating a liquid material that can form a swellable resin film on the surface of the insulative substrate 1 and then performing drying and a method of coating the liquid material on a support substrate, then performing drying to form a resin film, and transferring the swellable resin film to the surface of the insulative substrate 1.

Examples of liquid materials that can form the swellable resin film include suspensions or emulsions of elastomers. Specific examples of suitable elastomers include diene elastomers such as styrene-butadiene copolymers, acrylic elastomers such as acrylic acid ester copolymers, and polyester elastomers. With such elastomers, a swellable resin film with a desired swelling degree can be easily formed by adjusting a crosslinking degree or gelling degree of elastomer resin particles dispersed as a suspension or an emulsion.

A film in which the swelling ability changes depending on pH of the swelling liquid is particularly preferred as the swellable resin film. When such a film is used, it is possible to maintain high adhesion of the swellable resin film to the insulative substrate at a pH value in the catalyst-depositing step and enable easy peeling of the swellable resin film at a pH value in the film-separating step by using different liquid conditions in the catalyst-depositing step and the film-separating step.

More specifically, for example, when the catalyst-depositing step includes, for example, a step of performing treatment in a colloidal solution of an acidic plating catalyst (a colloidal solution of an acidic catalytic metal) at pH 1 to 3, and the film-separating step includes a step of swelling the swellable resin film in an alkaline solution at pH 12 to 14, it is preferred that the swellable resin film have a swelling degree of less than 50%, more preferably equal to or less than 40% with respect to the colloidal solution of the acidic plating catalyst, and have a swelling degree of equal to or greater than 50%, more preferably equal to or greater than 100%, even more preferably equal to or greater than 500% with respect to the alkaline solution.

Examples of such swellable resin film include a sheet obtained from an elastomer having a predetermined amount of carboxyl groups, a sheet obtained by curing the entire surface of a photocurable resist of an alkali development type that is used as a dry film resist (referred to hereinbelow as DFR) for patterning the printed wiring boards, or a sheet that is thermally curable or of an alkali development type.

Specific examples of elastomers having carboxyl groups include diene elastomers such as styrene-butadiene copolymers that include monomer units having carboxyl groups as copolymer components, thereby introducing carboxyl groups into the molecule, acrylic elastomers such as acrylic acid ester copolymers, and polyester elastomers. With such elastomers, the swellable resin film having the desired alkali swelling degree can be formed by adjusting the acid equivalent, crosslinking degree, or gelling degree of the elastomer dispersed as a suspension or an emulsion. The carboxyl groups contained in the elastomer cause the swellable resin film to swell in the alkali aqueous solution and peel off from the insulative substrate surface. The acid equivalent as referred to herein is a weight of the polymer in 1 equivalent of carboxyl groups.

Specific examples of monomer units having a carboxyl group include (meth)acrylic acid, fumaric acid, silicic acid, crotonic acid, itaconic acid, and maleic anhydride.

The content ratio of the carboxyl groups contained in the elastomer having the carboxyl groups is preferably 100 to 2000, more preferably 100 to 800, as an acid equivalent. Where the acid equivalent is too small, compatibility with solvent or other compositions tends to decrease, thereby decreasing the resistance to a plating pretreatment liquid. Where the acid equivalent is too large, peeling ability in an alkali aqueous solution tends to decrease.

Further, the molecular weight of the elastomer is preferably 10,000 to 1,000,000, more preferably 20,000 to 60,000. Where the molecular weight of the elastomer is too high, the peeling ability thereof tends to decrease, and where the molecular weight is too low, the viscosity of the elastomer decreases and therefore the uniform thickness of the swellable resin film is difficult to maintain and the resistance to the plating pretreatment solution tends to decrease.

The resin film can be composed of a polymer resin or a resin composition including the polymer resin, the polymer resin being obtained by polymerizing (a) at least one type of monomer of a carboxylic acid having at least one polymerizable unsaturated group in a molecule, or an anhydride thereof, and (b) at least one type of monomer that can be polymerized with the monomer (a).

The resin composition may include the polymer resin as the main resin and also additionally contain at least one component selected from oligomers, monomers, fillers, or other additives. The main resin may be a linear polymer having thermoplastic properties. The polymer can be branched by grafting to control flowability and crystallinity thereof. The molecular weight of the polymer is about 1000 to 500,000, preferably 5000 to 50,000, as represented by a weight-average molecular weight. Where the molecular weight is too low, bending ability of the film and resistance thereof to a plating nucleating reagent (acid resistance) tend to decrease. Where the molecular weight is too high, alkali peeling ability and pasting ability when a dry film is produced tend to degrade. Further, crosslinking centers may be introduced to improve the resistance to a plating nucleating reagent solution, inhibit thermal deformation during laser processing, and control flowability.

The composition of the polymer resin serving as the main resin can be obtained, as described hereinabove, by polymerizing (a) a monomer of a carboxylic acid having at least one polymerizable unsaturated group in a molecule, or an anhydride thereof, and (b) a monomer that can be polymerized with the monomer (a). The well-known technique of obtaining such compositions is described, for example, in Japanese Patent Application Publication Nos. H7-281437, 2000-231190, and 2001-201851.

Examples of the monomer (a) include (meth)acrylic acid, fumaric acid, silicic acid, crotonic acid, itaconic acid, maleic anhydride, maleic half-ester, and butyl acrylate. These monomers may be used individually or in combinations of two or more thereof.

Examples of the monomer (b) typically include non-acidic monomers having (one) polymerizable unsaturated group in a molecule, but such a composition is not limiting. The monomer is selected to ensure various properties such as endurance in the plating process and flexibility of the cured film. Specific examples of the monomer include methyl (meth)acrylate, ethyl (meth)acrylate, iso-propyl (meth)acrylate, n-butyl (meth)acrylate, sec-butyl (meth)acrylate, tert-butyl (meth)acrylate, 2-hydroxyethyl (meth)acrylate, and 2-hydroxypropyl (meth)acrylate. Other examples include esters of vinyl alcohol such as vinyl acetate, (meth)acrylonitrile, styrene, or polymerizable styrene derivatives. Further, the monomer can be also obtained by polymerization of only a carboxylic acid including one of the above-described polymerizable unsaturated groups in a molecule, or an anhydride thereof. In addition, a monomer having a plurality of unsaturated groups can be selected as the monomer to be used in the polymer, so as to enable three-dimensional crosslinking, and a reactive functional group such as an epoxy group, a hydroxyl group, an amino group, an amido group, and a vinyl group can be introduced into the molecular skeleton. The amount of carboxyl groups contained in the resin may be 100 to 2000, preferably 100 to 800, as represented by an acid equivalent. The acid equivalent as referred to herein is a weight of the polymer having 1 equivalent of carboxyl groups therein. Where the acid equivalent is too low, compatibility with the solvent or other compositions decreases or the resistance to plating pretreatment solution tends to decrease. Where the acid equivalent is too high, peeling ability tends to decrease. The compounding ratio of the monomer (a) is 5 mass % to 70 mass %.

The monomers or oligomers are not particularly limited, provided that resistance to a plating nucleating reagent is ensured and the film can be easily separated with an alkali. Further, a plasticizer can be used as a tackifier in order to improve the pasting ability of the dry film (DFR). A crosslinking agent is added to increase endurance of various types. Specific examples thereof include methyl (meth)acrylate, ethyl (meth)acrylate, iso-propyl (meth)acrylate, n-butyl (meth)acrylate, sec-butyl (meth)acrylate, tert-butyl (meth)acrylate, 2-hydroxyethyl (meth)acrylate, and 2-hydroxypropyl (meth)acrylate. Other examples include esters of vinyl alcohol such as vinyl acetate, (meth)acrylonitrile, styrene, or polymerizable styrene derivatives. Further, the product can be also obtained by polymerization of only a carboxylic acid including one of the above-described polymerizable unsaturated groups in a molecule, or an anhydride thereof. In addition, polyfunctional unsaturated compounds may be also included. The abovementioned monomers or oligomers obtained by reaction of the monomers may be used. Two or more other photopolymerizable monomers can be also included in addition to the above-described monomers. Examples of the monomers include 1,6-hexanediol di(meth)acrylate, 1,4-cyclohexanediol di(meth)acrylate, polyoxyalkylene glycol di(meth)acrylates such as polypropylene glycol di(meth)acrylate, polyethylene glycol di(meth)acrylate, and polyoxyethylene polyoxypropylene glycol di(meth)acrylate, 2-di(p-hydroxyphenyl)propane di(meth)acrylate, glycerol tri(meth)acrylate, dipentaerythritol penta(meth)acrylate, trimethylol propane triglycidyl ether tri(meth)acrylate, bisphenol A diglycidyl ether tri(meth)acrylate, 2,2-bis(4-methacryloxypentaethoxyphenyl)propane, and polyfunctional (meth)acrylates including an urethane group. The abovementioned monomers or oligomers obtained by reaction of the monomers may be used.

Further, a filler may be also included. The filler is not particularly limited, and suitable examples thereof include silica, aluminum hydroxide, magnesium hydroxide, calcium carbonate, clays, kaolin, titanium oxide, barium sulfate, alumina, zinc oxide, talc, mica, glass, potassium titanate, wollastonite, magnesium sulfate, aluminum borate, and organic fillers. The resist thickness is generally as small as about 1 μm to 10 μm and therefore a filler of small size is preferred. It is preferred that the filler have a small average particle size and the coarse particles be cut, but the coarse particles can be also removed by grinding or filtration during dispersing.

Examples of other additives include photopolymerizable resins (photopolymerization initiators), polymerization inhibitors, coloring agents (dyes, pigments, color-developing pigments), thermal polymerization initiators, and epoxy or urethane crosslinking agents.

In the printed board processing process of the embodiment of the present invention, for example, laser processing can be used, and in the case of laser processing, the resist material should be imparted with laser ablation ability. A carbon dioxide laser, an epoxy laser, or a UV-YAG laser can be selected as a laser processing device. Each of these laser processing devices has an intrinsic wavelength, and the productivity can be increased by using materials with high absorption power with respect to the wavelength. Among the aforementioned lasers, the UV-YAG laser is suitable for fine processing, and the laser wavelength is 355 nm of the triple harmonic and 266 nm of the fourth-order harmonic. Accordingly, high absorption power with respect to these wavelength is desirable. However, in some cases, materials with a rather low absorption power are preferred. More specifically, for example, where a resist with a low UV absorption power is used, UV light penetrates the resist and therefore energy can be concentrated in the underlying insulating layer processing. Since the merits thus differ depending on the laser beam absorption powder, it is preferred that a resist be used in which the laser beam absorption power is adjusted according to the circumstances.

Further, a sheet of a photocurable resin composition including a photopolymerization initiator and having as a resin component an acrylic resin, an epoxy resin, a styrene resin, a phenolic resin, or an urethane resin including the predetermined amount of carboxyl groups can be used as the DFR. Specific examples of such DFR include sheets obtained by curing the entire surface of dry films of photopolymerizable resin compositions such as disclosed in Japanese Patent Application Publication Nos. 2000-231190, 2001-201851, and H11-212262, or for example UFG series produced by Asahi Kasei Corp. and marketed as DFR of an alkali development type.

Other examples of the swellable resin film include a resin including carboxyl groups and having rosin as the main component (for example, "NAZDAR 229" manufactured by Yoshikawa Chemical Industries, Ltd.) and a resin having phenol as the main component (for example, "104F" manufactured by LEKTRACHEM).

The swellable resin film can be easily formed by coating the resin suspension or emulsion on the insulative substrate surface by a well-known conventional coating means such as a spin coating method or a bar coating method and then performing drying or by attaching a DFR formed on a support substrate to the insulative substrate surface by using a vacuum laminator or the like and then curing over the entire surface.

In addition to the above-described films, the following films can be used as the resin film. For example, the following materials can be used as the resin material constituting the resin film.

Properties necessary for the resin material constituting the resin film include, for example, (1) high resistance to a liquid (plating nucleating reagent) into which the insulative substrate having the resin film formed thereon is dipped in the below-described catalyst-depositing step; (2) the possibility of removing the resin film (resist) in an easy manner in the below-described film-separating step, for example, a step in which the insulative substrate having the resin film formed thereon is dipped in an alkali; (3) high film forming ability; (4) easy conversion into a dry film (DFR), and (5) high storage ability.

For example, when an acidic Pd—Sn colloidal catalyst system is used as the plating nucleating reagent, which will be described below in greater detail, the reagent is an entirely acidic (pH 1 to 2) aqueous solution. When an alkaline Pd ion catalyst system is used, the catalyst-imparting activator is mildly alkaline (pH 8 to 12), but the system is otherwise acidic. It follows from above, that the resistance to a plating nucleating reagent requires the resist to be resistant to pH 1 to 11, preferably pH 1 to 12. The resistance as referred to herein means that when a sample having a resist film formed thereon is dipped into the reagent, the resist is sufficiently prevented from swelling or dissolution and can function as a resist. The typical conditions include a dipping temperature of from room temperature to 60° C., a dipping time of 1 min to 10 min, and a resist thickness of 1 μm to about 10 μm, but these conditions are not limiting.

The alkali peeling reagent that is used in the film-separating step is described below. For example, a NaOH aqueous solution or a sodium carbonate aqueous solution is typically used. The pH thereof is 11 to 14, and it is desirable that the resist film could be easily separated at pH from 12 to 14. Typically, the concentration of the NaOH aqueous solution is about 1% to 10%, the processing temperature is from room temperature to 50° C., the processing time is 1 min to 10 min, and a dipping or spray treatment is used, but these conditions are not limiting.

Film forming ability is also important for forming the resist on an insulating material. Uniform film formation that is free from cracking or the like is required. Further, dry film conversion is performed in order to simplify the manufacturing process and reduce the material cost, but film bending ability is required to ensure handling ability. The resist converted into a dry film is pasted on the insulating material with a laminator (roll, vacuum). The pasting temperature is from room temperature to 160° C. No limitation is placed on pressure and time. Thus, tackiness is required during pasting. For this reason, and also for preventing the adhesion of dust, a three-layer structure is typically employed in which the resist converted into a dry film is sandwiched between a carrier film and a cover film, but such a structure is not limiting.

As for storage ability, the suitability for storage at room temperature is most important, but the suitability for storage in a refrigerator or cooler is also necessary. It is thus necessary that the dry film composition demonstrate no separation or decrease in bending ability and cracking at a low temperature.

The resin composition of the resist material may include a main resin (binder resin) as the necessary component and also additionally include at least one component selected from oligomers, monomers, fillers, or other additives.

The main resin may be a linear polymer having thermoplastic properties. The polymer can be branched by grafting to control flowability and crystallinity thereof. The molecular weight of the polymer is about 1000 to 500,000, preferably 5000 to 50,000, as represented by a weight-average molecular weight. Where the molecular weight is too low, bending ability of the film and resistance thereof to a plating nucleating reagent (acid resistance) tend to decrease. Where the molecular weight is too high, alkali peeling ability and pasting ability when a dry film is produced tend to degrade. Further, crosslinking centers may be introduced to improve the resistance to a plating nucleating reagent solution, inhibit thermal deformation during laser processing, and control flowability.

The composition of the main resin can be obtained by polymerizing (a) a monomer of a carboxylic acid having at least one polymerizable unsaturated group in a molecule or an anhydride thereof and (b) a monomer that can be polymerized with the monomer (a). The well-known technique of obtaining such compositions is described, for example, in Japanese Patent Application Publication Nos. 7-281437, 2000-231190, and 2001-201851. Examples of the monomer (a) include (meth)acrylic acid, fumaric acid, silicic acid, crotonic acid, itaconic acid, maleic anhydride, maleic half-ester, and butyl acrylate. These monomers may be used individually or in combinations of two or more thereof. Examples of the monomer (b) typically include non-acidic monomers having (one) polymerizable unsaturated group in a molecule, but such a composition is not limiting. The monomer is selected to ensure various properties such as endurance in the plating process and flexibility of the cured film. Specific examples of the monomer include methyl (meth)acrylate, ethyl (meth) acrylate, iso-propyl (meth)acrylate, n-butyl (meth)acrylate, sec-butyl (meth)acrylate, tert-butyl (meth)acrylate, 2-hydroxyethyl (meth)acrylate, and 2-hydroxypropyl (meth)acrylate. Other examples include esters of vinyl alcohol such as vinyl acetate, (meth)acrylonitrile, styrene, or polymerizable styrene derivatives. Further, the monomer can be also obtained by polymerization of only a carboxylic acid including one of the above-described polymerizable unsaturated groups in a molecule, or an anhydride thereof. In addition, a monomer having a plurality of unsaturated groups can be selected as the monomer to be used in the polymer, so as to enable three-dimensional crosslinking, and a reactive functional group such as an epoxy group, a hydroxyl group, an amino group, an amido group, and a vinyl group can be introduced into the molecular skeleton. The amount of carboxyl groups contained in the resin may be 100 to 2000, preferably 100 to 800, as represented by an acid equivalent. The acid equivalent as referred to herein is a weight of the polymer having 1 equivalent of carboxyl groups therein. Where the acid equivalent is too low, compatibility with the solvent or other compositions decreases or the resistance to plating pretreatment solution tends to decrease. Where the acid equivalent is too high, peeling ability tends to decrease. The compounding ratio of the monomer (a) is 5 mass % to 70 mass %.

The monomers or oligomers are not particularly limited, provided that resistance to a plating nucleating reagent is ensured and the film can be easily separated with an alkali. Further, a plasticizer can be used as a tackifier in order to improve the pasting ability of the dry film (DFR). A crosslinking agent is added to increase endurance of various types. Specific examples thereof include methyl (meth)acrylate, ethyl (meth)acrylate, iso-propyl (meth)acrylate, n-butyl (meth)acrylate, sec-butyl (meth)acrylate, tert-butyl (meth) acrylate, 2-hydroxyethyl (meth)acrylate, and 2-hydroxypropyl (meth)acrylate. Other examples include esters of vinyl alcohol such as vinyl acetate, (meth)acrylonitrile, styrene, or polymerizable styrene derivatives. Further, the product can be also obtained by polymerization of only a carboxylic acid including one of the above-described polymerizable unsaturated groups in a molecule, or an anhydride thereof. In addition, polyfunctional unsaturated compounds may be also included. The abovementioned monomers or oligomers obtained by reaction of the monomers may be used. Two or more other photopolymerizable monomers can be also included in addition to the above-described monomers. Examples of the monomers include 1,6-hexanediol di(meth) acrylate, 1,4-cyclohexanediol di(meth)acrylate, polyoxyalkylene glycol di(meth)acrylates such as propylene glycol di(meth)acrylate, polyethylene glycol di(meth)acrylate, and polyoxyethylene polyoxypropylene glycol di(meth)acrylate, 2-di(p-hydroxyphenyl)propane di(meth)acrylate, glycerol tri (meth)acrylate, dipentaerythritol penta(meth)acrylate, trimethylol propane triglycidyl ether tri(meth)acrylate, bisphenol A diglycidyl ether tri(meth)acrylate, 2,2-bis(4-methacryloxypentaethoxyphenyl)propane, and polyfunctional (meth) acrylates including an urethane group. The abovementioned monomers or oligomers obtained by reaction of the monomers may be used.

Further, a filler may be also included. The filler is not particularly limited, and suitable examples thereof include silica, aluminum hydroxide, magnesium hydroxide, calcium carbonate, clays, kaolin, titanium oxide, barium sulfate, alumina, zinc oxide, talc, mica, glass, potassium titanate, wollastonite, magnesium sulfate, aluminum borate, and organic fillers. The resist thickness is generally as small as about 1 µm to 10 µm and therefore a filler of small size is preferred. It is preferred that the filler have a small average particle size and the coarse particles be cut, but the coarse particles can be also removed by grinding or filtration during dispersing.

Examples of other additives include photopolymerizable resins (photopolymerization initiators), polymerization inhibitors, coloring agents (dyes, pigments, color-developing pigments), thermal polymerization initiators, and epoxy or urethane crosslinking agents.

In the printed board processing process of the embodiment of the present invention, for example, laser processing can be used, and in the case of laser processing, the resist material should be imparted with laser ablation ability. A carbon dioxide laser, an epoxy laser, or a UV-YAG laser can be selected as a laser processing device. Each of these laser processing devices has an intrinsic wavelength, and the productivity can be increased by using materials with high absorption power with respect to the wavelength. Among the aforementioned lasers, the UV-YAG laser is suitable for fine processing, and the laser wavelength is 355 nm of the triple harmonic and 266 nm of the fourth-order harmonic. Accordingly, high absorption power with respect to these wavelengths is desirable. However, in some cases, materials with a rather low absorption power are preferred. More specifically, for example, where a resist with a low UV absorption power is used, UV light penetrates the resist and therefore energy can be concentrated in the underlying insulating layer processing. Since the merits thus differ depending on the laser beam absorption powder, it is preferred that a resist be used in which the laser beam absorption power is adjusted according to the circumstances.

<Circuit Pattern-Forming Step>

The circuit pattern-forming step is a step of forming a circuit pattern portion such as a circuit groove 3 in the insulative substrate 1. As described above, not only the circuit groove 3, but also a recessed portion of the resin film 2 that reaches the surface of the insulative substrate 1 or the through hole 4 may be formed as the circuit pattern portion.

A method for forming the circuit pattern portion is not particularly limited. For example, a method can be used by which the circuit groove 3 of desirable shape and depth is formed by performing mechanical processing such as laser processing, cutting such as dicing, and embossing of the insulative substrate 1, which has the resin film 2 formed thereon, from the outer surface side of the resin film 2. When a high-precision fine circuit is formed, it is preferred that the laser processing be used. With laser processing, the cutting depth can be freely adjusted by changing the laser output or the like. Further, embossing performed with a fine resin mold such as used, for example, in the field of nano-imprinting is preferably used as the aforementioned embossing.

The through hole 4 for forming a via hole or the like may be formed as part of the circuit groove 3.

This step determines the shape of the circuit pattern portion, such as the shape and depth of the circuit groove 3 or the diameter and position of the through hole 4. Further, in the circuit pattern-forming step, engraving may be performed to a depth equal to or greater than the thickness of the resin film 2, in other words, to a depth equal to the thickness of the resin film 2, or to a depth exceeding the thickness of the resin film 2.

The width of the circuit pattern portion, such as the circuit groove 3, formed in the circuit pattern-forming step is not particularly limited. When laser processing is used, a fine circuit with a line width of equal to or less than 20 µm can be easily formed. When a step between the electric circuit and the insulative substrate is eliminated by fill-up plating, the depth of the circuit groove becomes the depth of the electric circuit formed in the present embodiment.

<Catalyst-Depositing Step>

In the catalyst-depositing step, a plating catalyst or a precursor thereof is deposited to the surface of the circuit pattern portion such as the circuit groove 3 and to the surface of the resin film 2. In this case, when the through hole 4 is formed, the plating catalyst or the precursor thereof is also deposited to the inner wall surface of the through hole 4.

The plating catalyst 5 or the precursor thereof is deposited to form an electroless plating film only on the portion where the electroless plating film is wished to be formed by the electroless plating in the plating step. The plating catalyst is not particularly limited, provided that it is known as a catalyst for electroless plating. Further, the plating catalyst precursor may be deposited in advance, and the plating catalyst may be produced after the resin film is separated. Specific examples of the plating catalyst include metallic palladium (Pd), platinum (Pt), and silver (Ag), or the precursors that can generate these metals.

The plating catalyst 5 or the precursor thereof can be deposited, for example, by performing the treatment with an acidic Pd—Sn colloidal solution that is used for the treatment under an acidic condition of pH 1 to 3 and then performing the treatment with an acidic solution. More specifically, for example, the following method can be used.

First, oils that have adhered to the surface of the insulative substrate 1 where the circuit groove 3 and the through hole 4 have been formed is cleaned for a predetermined time in a surfactant solution (cleaner—conditioner). Then a soft etching treatment is performed, as necessary, with a soft etching agent of a sodium persulfate—sulfuric acid system. Acid cleaning is then performed in an acidic solution such as an aqueous solution of sulfuric acid or an aqueous solution of hydrochloric acid with pH 1 to 2. A pre-dip treatment is then performed by dipping into a pre-dip solution having an aqueous solution of stannous chloride with a concentration of about 0.1% as the main component and causing the adsorption of chloride ions on the surface of the insulative substrate 1. Then, cohesion and adsorption of Pd and Sn are caused by further dipping into an acidic plating catalyst colloidal solution such as an acidic Pd—Sn colloid with pH 1 to 3 that include stannous chloride and palladium chloride. A redox reaction ($SnCl_2+PdCl_2 \rightarrow SnCl_4+Pd\downarrow$) is then induced between the adsorbed stannous chloride and palladium chloride. As a result, metallic palladium, which is a plating catalyst, is precipitated.

A well-known acidic Pd—Sn colloidal catalyst solution can be used as the acidic plating catalyst colloidal solution, and a conventional plating process using the acidic plating catalyst colloidal solution can be used. Such a process can be implemented with a commercial system supplied by Rohm and Haas Electronic Materials Co., Ltd.

With such a catalyst-depositing treatment, the plating catalyst 5 or the precursor thereof can be deposited to the surface of the circuit groove 3, the inner wall surface of the through hole 4, and the surface of the resin film 2.

<Film-Separating Step>

In the film-separating step, the resin film 2 is separated from the insulative substrate 1 subjected to the catalyst-depositing step.

A method for removing the resin film 2 is not particularly limited. The following specific methods can be used therefor: a method of swelling with a predetermined solution (swelling liquid) and then peeling the resin film 2 off from the insulative substrate 1, a method of swelling the resin film 2 with a predetermined solution (swelling liquid), then partially dissolving the resin film 2, and thereafter peeling the resin film 2 off from the insulative substrate 1, and a method of dissolving the resin film 2 with a predetermined solution (swelling liquid) and removing the resin film 2. The swelling liquid is not particularly limited, provided that the resin film 2 can be swelled thereby. The aforementioned swelling or dissolution is performed by dipping the insulative substrate 1 coated with the resin film 2 into the swelling liquid for a predetermined time. The removal efficiency may be increased by performing irradiation with ultrasound waves during dipping. A light force may be applied for pulling during swelling and peeling.

The case in which the aforementioned swellable resin film is used as the resin film 2 is described below.

A liquid (swelling liquid) that causes the swellable resin film 2 to swell can be used without any particular limitation, provided that the swellable resin film 2 can be swelled or dissolved substantially without decomposition or dissolution of the insulative substrate 1 and the plating catalyst 5 or the precursor thereof. Further, a liquid that causes the swellable resin film 2 to swell to the degree at which the swellable resin film can be easily peeled off is preferred. Such a swelling liquid can be selected as appropriate according to the type or thickness of the swellable resin film 2. More specifically, when the swellable resin film is formed from an elastomer such as a diene elastomer, an acrylic elastomer, and a polyester elastomer, a polymer resin obtained by polymerizing (a) at least one type of monomer of a carboxylic acid having at least one polymerizable unsaturated group in a molecule, or an anhydride thereof, and (b) at least one type of monomer that can be polymerized with the monomer (a), a resin composition including the polymer resin, or an acrylic resin including carboxyl groups, it is preferred that an alkali aqueous solution, for example, such as an aqueous solution of sodium hydroxide with a concentration of about 1 to 10% be used.

When a plating process in which the treatment is performed under the above-described acidic conditions is used in the catalyst-depositing step, it is preferred that the swellable resin film 2 be formed from an elastomer such as a diene elastomer, an acrylic elastomer, and a polyester elastomer, a polymer resin obtained by polymerizing (a) at least one type of monomer of a carboxylic acid having at least one polymerizable unsaturated group in a molecule, or an anhydride thereof, and (b) at least one type of monomer that can be polymerized with the monomer (a), a resin composition including the polymer resin, or an acrylic resin including carboxyl groups, such that demonstrates a swelling degree of less than 50%, preferably equal to or less than 40%, under acidic conditions and a swelling degree of equal to or greater than 50% under alkaline conditions. Such a swellable resin film is easily swelled and peeled off by an alkali aqueous solution such that has pH 12 to 14, for example, an aqueous solution of sodium hydroxide with a concentration of about 1 to 10%. Irradiation with ultrasound waves can be performed during dipping in order to improve peeling ability. The film may be peeled off by pulling with a light force, if necessary.

A method in which the insulative substrate 1 coated with the swellable resin film 2 is dipped for a predetermined time into the swelling liquid is an example of methods for swelling the swellable resin film 2. It is preferred that irradiation with ultrasound waves be performed during dipping to improve peeling ability. When the film cannot be peeled off by swelling alone, the film can be pulled off by a light force as necessary.

<Plating Treatment Step>

In the plating treatment step, the insulative substrate 1 from which the resin film 2 has been separated is subjected to electroless plating.

A method by which the insulative substrate 1 partially coated with the plating catalyst 5 or the precursor thereof is immersed into the electroless plating solution and the electroless plating film (plating film) is deposited only on the portions coated with the plating catalyst 5 or the precursor thereof can be used for the electroless plating treatment.

Examples of metals that can be used for electroless plating include copper (Cu), nickel (Ni), cobalt (Co), and aluminum (Al). Among these metals, the plated film including Cu as the main component is preferred because such film excels in electric conductivity. It is also preferred than Ni be included because the film excels in corrosion resistance and adhesion to a solder.

The thickness of the electroless plating film 6 is not particularly limited. More specifically, it is preferred that the thickness be, for example, 0.1 μm to 10 μm, more preferably about 1 μm to 5 μm. In particular, by increasing the depth of the circuit groove 3, it is possible to form metal wiring of a large cross-sectional area as a plating film of a large thickness. Such a configuration is preferred because the metal wiring strength can be increased.

In the plating step, the electroless plating film is deposited only on the portion of the surface of the insulative substrate 1 where the plating catalyst 5 or the precursor thereof remains. As a result, an electrically conductive layer can be formed with good accuracy only on the portion where the circuit pattern portion is wished to be formed. Meanwhile, the deposition of the electroless plating film on the portion where the circuit pattern portion has not been formed can be inhibited. Therefore, even when a plurality of fine circuits with a small wire width are formed with a small pitch therebetween, no unnecessary plating film remains between the adjacent circuits. As a result, the occurrence of short circuit or migration can be inhibited.

<Inspection Step>

In the method of producing a circuit board according to the present embodiment, the resin film 2 may include a fluorescent substance and the method may further include an inspection step in which film-separating failure is inspected by monitoring light emission from the fluorescent substance after the film-separating step. Thus, by introducing a fluorescent substance into the resin film 2, it is possible to inspect the presence of film-separating failure and location of the film-separating failure by monitoring light emission from the fluorescent substance generated by irradiation of the surface that is the inspection object with ultraviolet radiation or near-ultraviolet radiation after the film-separating step. In the manufacturing method according to the present embodiment, it is possible to form an electric circuit with very small line width and line spacing.

Figure 2:
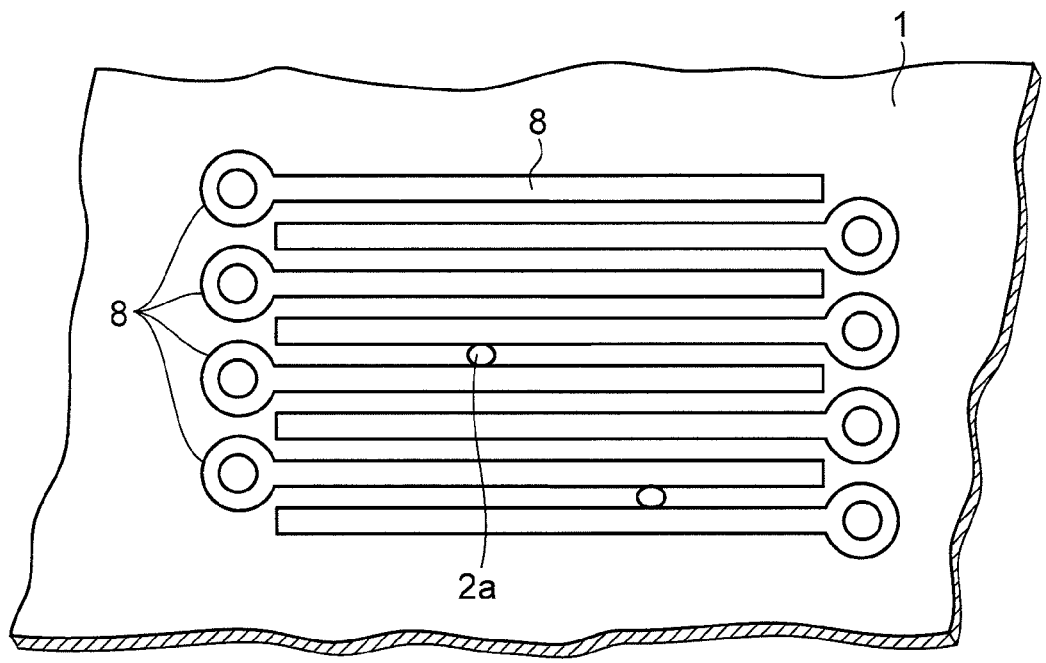
FIG. 2 is an explanatory drawing for explaining the inspection step performed to inspect the film-separating failure by introducing a fluorescent substance into the resin film and monitoring light emission from the fluorescent substance.

When an electric film with a very small line width and line spacing is formed, it is noteworthy that the resin film is not completely separated and remains between the adjacent electric circuits 8 formed on the surface of the insulative substrate 1, for example, as shown in FIG. 2. In such a case, an electroless plating film is formed in such portions, thereby causing migration or short circuiting. Where the inspection step is included, it is possible to inspect the presence of film-separating failure or location of the film-separating failure even in such cases. FIG. 2 is an explanatory drawing for explaining the inspection step performed to inspect the film-separating failure by introducing a fluorescent substance into the resin film and monitoring light emission from the fluorescent substance.

The fluorescent substance that can be introduced into the resin film 2 for use in the inspection step is not particularly limited, provided that the fluorescent substance demonstrates a light emission characteristic under irradiation with light from a predetermined light source. Specific examples of suitable fluorescent substances include fluoresceine, eosine, and pyronine G.

The portion in which light emission from the fluorescent substance is detected in the inspection step is a portion where a residue 2a of the resin film 2 remains. Therefore, by removing the portion where the light emission has been detected, it is possible to inhibit the formation of the electroless plating film in this portion. As a result, the occurrence of migration and short circuit can be completely inhibited.

<Desmear Treatment Step>

The method of producing a circuit board according to the present embodiment may further include a desmear treatment step of performing a desmear treatment after the aforementioned plating treatment step, more specifically before or after the fill-up plating. By performing the desmear treatment, it is possible to remove the unnecessary resin that has adhered to the electroless plating film. Further, when a multilayer circuit board is assumed that is provided with the obtained circuit board, the surface of the portion of the insulative substrate where the electroless plating film has not been formed can be roughened to increase adhesion to the upper layer of the circuit board. In addition, a via bottom may be also subjected to the desmear treatment. As a result, it is possible to remove the unnecessary resin that has adhered to the via bottom. Further, the desmear treatment is not particularly limited and the well-known desmear treatment can be used. More specifically, the treatment can be performed, for example, by dipping into a permanganic acid solution.

A circuit board 10 such as shown in FIG. 1E is obtained by the above-described steps.

Figure 3:
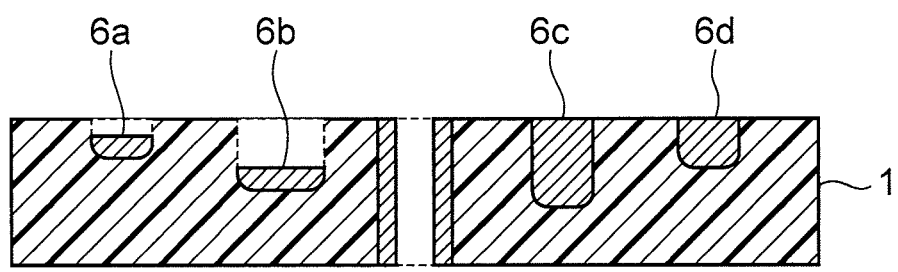
FIG. 3 is a schematic cross-sectional view showing an electroless plating film formed when a circuit pattern portion (circuit groove) in which engraving is performed on the insulative substrate to the depth exceeding the resin film thickness is formed in the circuit pattern-forming step.

When engraving is performed to a depth exceeding the thickness of the resin film 2 in the circuit pattern-forming step, an electric circuit composed of the electroless plating film 6a can be formed to a deep portion of the insulative substrate 1, as shown in FIG. 3. Further, a circuit can be also formed at positions with mutually different depth (for example, 6a and 6b in FIG. 3) between a plurality of electrically conductive layers. When circuit grooves having predetermined depths are formed in the insulative substrate 1, as shown by 6c and 6d in FIG. 3, and a circuit is then formed so as to fill the circuit grooves by the electroless treatment circuit, it is possible to form easily a circuit with a large cross-sectional surface area. Such an approach is preferred because the electric capacitance of the circuit can be increased.

Second Embodiment

In the first embodiment, a circuit board is explained that is obtained by forming an electric circuit on a flat insulative substrate, but the present invention is not limited to such a configuration. More specifically, a circuit board (steric circuit board) provided with an electric circuit with accurate wiring can be also obtained by using an insulative substrate of a three-dimensional shape such that has a stepwise steric surface as the aforementioned insulative substrate.

A method of producing a steric circuit board according to the second embodiment will be explained below.

FIGS. 4A to 4E are schematic cross-sectional views illustrating each step of the process of producing a steric circuit board according to the second embodiment.

Figure 4A:
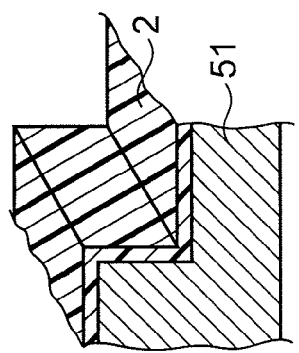
FIGS. 4A to 4E are schematic cross-sectional views for explaining each step of the method of producing a steric circuit board according to the second embodiment.

First, a resin film 2 is formed on the surface of a steric insulative substrate 51 having a stepwise portion as shown in FIG. 4A. This step corresponds to a film-forming step.

Various resin molded bodies such that can be used for producing the well-known conventional steric circuit board can be used without any particular limitation as the steric insulative substrate 51. From the standpoint of production efficiency, it is preferred that such a molded body be obtained by injection molding. Specific examples of resin materials for obtaining the resin molded body include a polycarbonate resin, a polyamide resin, various polyester resins, a polyimide resin, and a polyphenylene sulfide resin.

A method for forming the resin film 2 is not particularly limited. For example, a forming method similar to that of the first embodiment can be used.

Figure 4B:
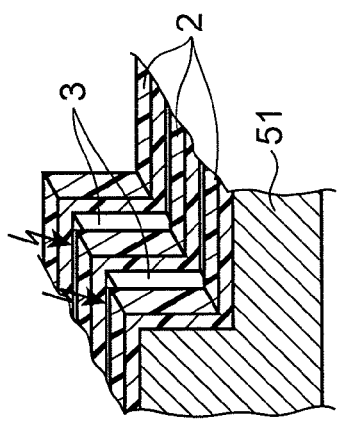

Then, a circuit pattern portion such as a circuit groove 3 with a depth equal to or greater than the thickness of the resin film 2 is formed by taking the outer surface of the resin film 2 as a reference as shown in FIG. 4B. A method for forming the circuit pattern portion is not particularly limited. For example, a forming method similar to that of the first embodiment can be used. A portion where the electroless plating film will be formed by electroless plating, that is, a portion where the electric circuit will be formed, is determined by the circuit formation portion such as the circuit groove 3. This step corresponds to the circuit pattern-forming step.

Figure 4C:
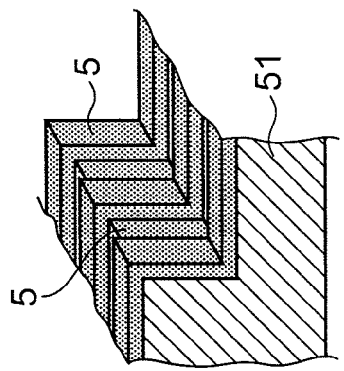

Then, as shown in FIG. 4C, a plating catalyst 5 or a precursor thereof is deposited to the surface of the circuit pattern portion such as the circuit groove 3 and the surface of the resin film 2 where the circuit pattern portion has not been formed. A method for depositing the plating catalyst 5 or the precursor thereof is not particularly limited. For example, a method similar to that of the first embodiment can be used. This step corresponds to the catalyst-depositing step. With such a catalyst-depositing treatment, the plating catalyst 5 or the precursor thereof can be deposited to the surface of the circuit pattern portion such as the circuit groove 3 and the surface of the resin film 2, as shown in FIG. 4C.

Figure 4D:
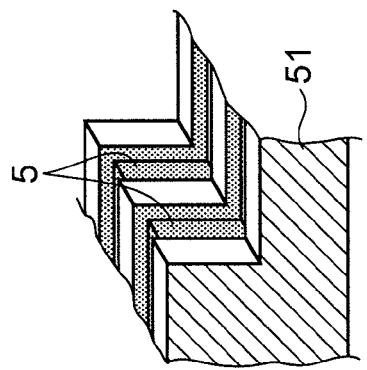

Then, as shown in FIG. 4D, the resin film 2 is separated from the steric insulative substrate 51. As a result, the plating catalyst 5 or the precursor thereof can be left only on the surface of the portion of the steric insulative substrate 51 where the circuit pattern portion such as the circuit groove 3 has been formed. Meanwhile, the plating catalyst 5 or the precursor thereof that has been deposited to the surface of the resin film 2 is separated together with the resin film 2 in a state of being supported by the resin film 2. A method for removing the resin film 2 is not particularly limited. For example, a method similar to that of the first embodiment can be used. This step corresponds to the film-separating step.

Figure 4E:
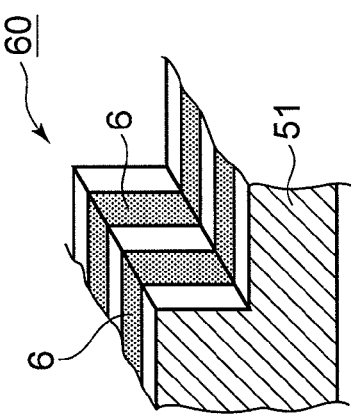
Figure 5A:
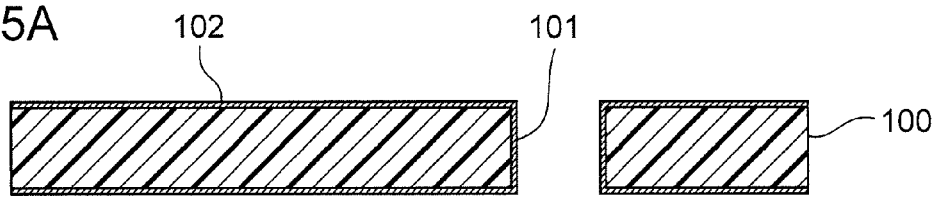
FIGS. 5A to 5E are schematic cross-sectional views illustrating steps of forming a metal wiring by the conventional full additive method.
Figure 5B:
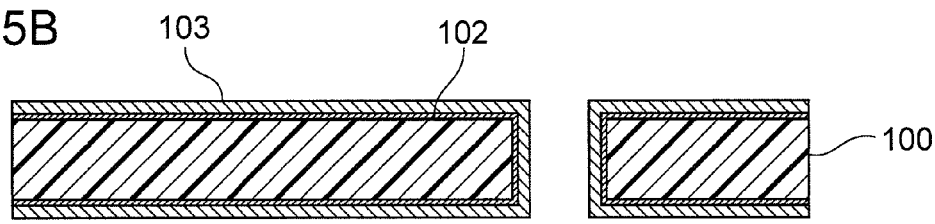
Figure 5C:
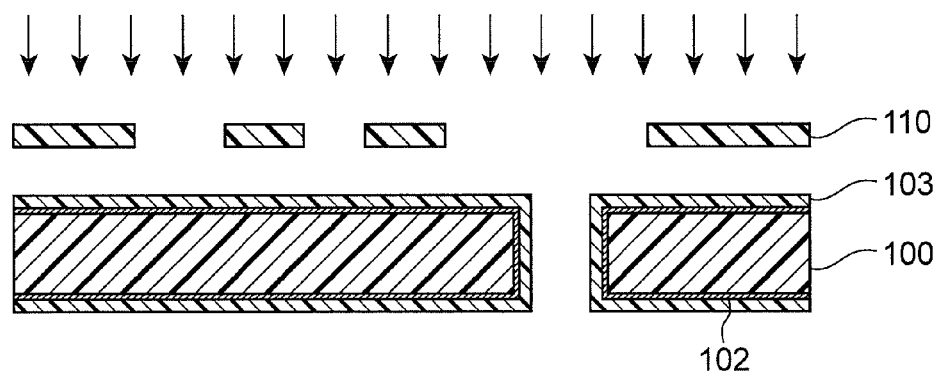
Figure 5D:
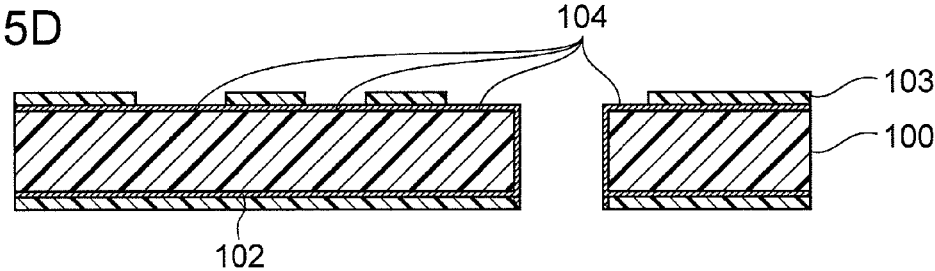
Figure 5E:
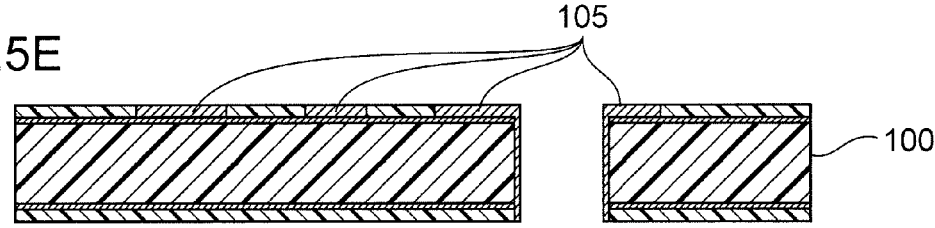

Then, as shown in FIG. 4E, the steric insulative substrate 51 from which the resin film 2 has been separated is electroless plated. As a result, an electroless plating film 6 is formed only on the portion where the plating catalyst 5 or the precursor thereof remains. Thus, the electroless plating film 6 that will serve as an electric circuit is formed on the portion where the circuit groove 3 or the through hole 4 has been formed. A method for forming the electroless plating film 6 is not particularly limited. For example, a forming method similar to that of the first embodiment can be used. This step corresponds to the plating treatment step.

In the above-described steps, a circuit board 60 having the electric circuit 6 formed thereon is formed on the steric insulative substrate 51 of a three-dimensional shape such as shown in FIG. 4E. In the circuit board formed in the above-described manner 60, the electric circuit can be formed with high accuracy even when the electric circuit formed on the insulative substrate has narrow lines and small spacing between the lines. Further, the circuit board according to the present embodiment can be formed accurately and in an easy manner even on the surface having a stepwise portion of the steric circuit board.

The embodiments of the present invention are explained above in detail, but the explanation given above is merely illustrative in all of the aspects thereof, and the present invention is not limited thereto. Innumerable variations that have not been presented by way of examples can be envisioned within the scope of the invention.

EXAMPLES

The manufacturing method of the present embodiment will be described below in greater detail on the basis of examples thereof. The scope of the present invention should not be construed as being somehow limited by the below-described examples.

Example 1

A film of a styrene-butadiene copolymer (SBR) with a thickness of 2 μm was formed on the surface of an epoxy resin base material R1766 manufactured by Panasonic Electric Works Co., Ltd. with a thickness of 100 μm. The film was formed by coating a methyl ethyl ketone (MEK) suspension (manufactured by Japan Zeon Co., Ltd., acid equivalent 600, particle diameter 200 nm, content ratio of solids 15%) of the styrene-butadiene copolymer (SBR) on the surface of the epoxy resin base material and drying for 30 min at a temperature of 80° C.

The epoxy resin base material having the film formed thereon was then subjected to groove formation processing of forming grooves of substantially rectangular cross section with a thickness of 20 μm and a depth of 30 μm by laser processing. A MODEL 5330 equipped with a UV-YAG laser and manufactured by ESI was used for the laser processing.

The epoxy resin base material having the groove formed therein was dipped into a cleaner conditioner (surfactant solution, pH<1, manufactured by Rohm & Haas, C/N3320) and then washed with water. Soft etching was then performed with a soft etching agent with pH<1 of a sodium persulfate—sulfuric acid system. A pre-dip step was then performed by using PD404 (manufactured by Shipley Far East Ltd., pH<1). Palladium serving as nuclei for electroless copper plating was then adsorbed in a state of tin-palladium colloid on the epoxy resin base material by dipping into an acidic Pd—Sn colloidal solution (CAT 44, manufactured by Shipley Far East Ltd.) including stannous chloride and palladium chloride.

Palladium nuclei were then generated by dipping into an accelerator reagent solution (ACC19E, manufactured by Shipley Far East Ltd.) with pH<1. The epoxy resin based material was then dipped for 10 min into a 5% aqueous solution of sodium hydroxide with pH 14, while subjecting the base material to ultrasonic treatment. As a result, the SBR film on the surface was swelled and readily peeled off. In this case, no pieces of the SBR film remained on the surface of the epoxy resin base material. The electroless copper plating treatment was then performed by dipping the epoxy resin base material into electroless plating solutions (CM328A, CM328L, CM328C, manufactured by Shipley Far East Ltd.).

An electroless copper plating film with a thickness of 3 μm to 5 μm was formed by the electroless copper plating treatment. The surface of the epoxy base material subjected to the electroless copper platting treatment was observed under a SEM (scanning electron microscope). It was found that the electroless plating film was accurately formed only on the portions processed by cutting.

The swelling degree of the swellable resin film was determined in the following manner.

The SBR suspension coated for forming the swellable resin film was coated on a separation paper and dried for 30 min at a temperature of 80° C. As a result, a resin film with a thickness of 2 μm was formed. A sample was then obtained by forcibly peeling off the formed film.

About 0.02 g of the sample obtained was weighed. The sample weight at this stage was taken as the weight before swelling m(b). The weighed sample was dipped for 15 min into 10 ml of a 5% aqueous solution of sodium hydroxide with a temperature of 20±2° C. Another sample was similarly dipped for 15 min into 10 ml of a 5% aqueous solution (pH 1) of hydrochloric acid with a temperature of 20±2° C.

Water that has adhered to the sample was removed by performing centrifugal separation for about 10 min at 1000 G by using a centrifugal separator. The weight of the swelled sample after centrifugal separation was measured and taken as the weight after swelling m(a). The swelling degree was calculated from the obtained weight before swelling m(b) and weight after swelling m(a) by the following formula: "Swelling Degree $SW=(m(a)-m(b))/(m(b)\times 100(\%))$". Other conditions corresponded to those stipulated by JIS L1015 8. 27 (Methods for Measuring Alkali Swelling Degree).

In this case, the swelling degree with respect to the 5% aqueous solution of sodium hydroxide with pH 14 was 750%. The swelling degree with respect to the 5% aqueous solution of hydrochloric acid with pH 1 was 3%.

Example 2

The process was performed similarly to Example 1, except that a carboxyl group-containing polymer (manufactured by Japan Zeon Co., Ltd., acid equivalent 500, weight-average molecular weight 25,000, content ratio of solids 20%) was used instead of the methyl ethyl ketone (MEK) suspension (manufactured by Japan Zeon Co., Ltd., acid equivalent 600, particle diameter 200 nm, content ratio of solids 15%) of the styrene-butadiene copolymer (SBR).

In this case, the swelling degree with respect to the 5% aqueous solution of sodium hydroxide with pH 14 was 1000%. The swelling degree with respect to the 5% aqueous solution of hydrochloric acid with pH 1 was 30%.

As described hereinabove, with the manufacturing method according to the present embodiment, the plating catalyst can be deposited only to the portions of the base material surface where the circuit is wished to be formed by peeling off the swellable resin film. Therefore, the electroless plating film can be accurately formed only on the portions to which the plating catalyst has been deposited. Further, since the swellable resin film can be easily peeled off by the swelling action, the film-separating step can be also performed accurately and easily.

As mentioned hereinabove, the present description discloses a variety of techniques, the main of which are compiled below.

One aspect of the present invention resides in a method of producing a circuit board, including: a film-forming step of forming a resin film on a surface of an insulative substrate; a circuit pattern-forming step of forming a circuit pattern portion by forming a recessed portion having a depth equal to or greater than a thickness of the resin film, with an outer surface of the resin film serving as a reference; a catalyst-depositing step of depositing a plating catalyst or a precursor thereof on a surface of the circuit pattern portion and a surface of the resin film; a film-separating step of removing the resin film from the insulative substrate; and a plating step of forming an electroless plating film only in a region where the plating catalyst or the precursor thereof remains after the resin film is separated.

With such a manufacturing method, the resin film is formed on the insulative substrate, the predetermined circuit pattern portion is thereafter formed by using laser processing or the like, and the plating catalyst or the precursor thereof is deposited to the surface of the circuit pattern portion and the surface of the resin film in a state in which the portions where the plating film is not to be formed is protected by the resin film. The resin film is then separated from the insulative substrate, thereby easily making it possible to leave the plating catalyst or the precursor thereof only on the portions where the plating film is wished to be formed and removing the plating catalyst or the precursor thereof from other portions. Therefore, by performing the plating step of forming an electroless plating film, it is possible to form easily the electroless plating film only on the portions where the plating film is wished to be formed, which is the location where the plating catalyst or the precursor thereof remains.

Therefore, a high-precision electric circuit can be easily formed on the insulative substrate. Thus, the contour of the circuit that is formed can be maintained with high accuracy. As a result, for example, even when a plurality of circuits are formed with a fixed spacing, pieces of the electroless plating film are prevented from remaining between the circuits and therefore the occurrence of short circuiting and migration can be inhibited. Further, a circuit with the desired depth can be formed.

In the above-described method of producing a circuit board, it is preferred that the film-separating step be a step of peeling off the resin film from the insulative substrate after the resin film is swelled with a predetermined liquid or part of the resin film is dissolved with a predetermined liquid. With such a manufacturing method, the resin film can be easily peeled off from the insulative substrate. Therefore, a high-precision electric circuit can be easier formed on the insulative substrate.

In the above-described method of producing a circuit board, it is preferred that a swelling degree of the resin film with respect to the liquid be equal to or greater than 50%. Where the resin film with such a swelling degree is used, the resin film can be easily peeled off from the insulative substrate. Therefore, a high-precision electric circuit can be easier formed on the insulative substrate. Resin films that have a high swelling degree with respect to the liquid and are dissolved in the liquid are also included in the aforementioned resin films.

In the above-described method of producing a circuit board, it is preferred that the catalyst-depositing step include a step of performing treatment in an acidic catalyst metal colloidal solution; the predetermined liquid in the film-separating step be an alkaline solution; and the resin film have a swelling degree with respect to the acidic catalyst metal colloidal solution of less than 50% and a swelling degree with respect to the alkaline solution of equal to or greater than 50%.

With such a manufacturing method, the resin film is unlikely to be peeled off in the catalyst-depositing step performed under acidic conditions and can be easily peeled off in the film-separating process performed with an alkaline solution after the catalyst-depositing step. As a result, the resin film is selectively peeled off in the film-separating step. Therefore, the portion where the electroless plating film is not to be formed can be accurately protected in the catalyst-depositing step, and the resin film can be easily peeled off in the film-separating step performed after the plating catalyst or the precursor thereof has been deposited. Therefore, more accurate circuit formation can be performed.

Further, in the above-described method of producing a circuit board, it is preferred that the film-separating step be a step of dissolving the resin film with a predetermined liquid and removing the resin film. With such a manufacturing method, the resin film can be easily separated from the insulative substrate. Therefore, a high-precision electric circuit can be easier formed on the insulative substrate.

Further, in the above-described method of producing a circuit board, it is preferred that the resin film be formed by coating a suspension or an emulsion of an elastomer on the insulative substrate surface and then performing drying. By using such a resin film, it is possible to form easily the resin film on the insulative substrate surface. Therefore, a high-precision electric circuit can be easier formed on the insulative substrate.

Further, in the above-described method of producing a circuit board, it is preferred that the resin film be formed by transferring a resin film formed on a support substrate onto the surface of the insulative substrate. It is also preferred that the resin film used for transferring be formed by coating a suspension or an emulsion of an elastomer on the support substrate surface and then performing drying. Using such a resin film is preferred because a large number of resin films can be prepared in advance and therefore the method is suitable for mass production.

Further, in the above-described method of producing a circuit board, it is preferred that the elastomer be selected from the group consisting of a diene elastomer, an acrylic elastomer, and a polyester elastomer that include a carboxyl group. It is also preferred that the diene elastomer be a styrene-butadiene copolymer. With such an elastomer, a resin film with the desired swelling degree can be easily formed by adjusting a crosslinking degree or gelling degree. Further, the swelling degree with respect to the liquid used in the film-separating step can be further increased and resin film that is soluble in the liquid can be also easily formed.

Further, in the above-described method of producing a circuit board, it is preferred that the resin film have, as a main component, a resin composed of an acrylic resin having carboxyl groups of 100 to 800 acid equivalent.

Further, in the above-described method of producing a circuit board, it is preferred that the resin film include a polymer resin or a resin composition including the polymer resin, the polymer resin being obtained by polymerizing (a) at least one type of monomer of a carboxylic acid having at least one polymerizable unsaturated group in a molecule, or an anhydride thereof, and (b) at least one type of monomer of that can be polymerized with the monomer (a). By using such a resin film, it is possible to form easily the resin film on the insulative substrate surface. Therefore, a high-precision electric circuit can be easier formed on the insulative substrate. Further, most of such resin films can be dissolved in the liquid used in the film-separating step, and not only the removal by peeling, but also the removal by dissolution can be effectively used.

Further, in the above-described method of producing a circuit board, it is preferred that the acid equivalent of the polymer resin in the resin film be 100 to 800.

Further, in the above-described method of producing a circuit board, it is preferred that the thickness of the resin film be equal to or less than 10 µm because a fine circuit can be formed with high accuracy.

Further, in the above-described method of producing a circuit board, it is preferred that a portion where a width of the circuit pattern portion is equal to or less than 20 µm be provided because a circuit requiring fine processing, such as an antenna circuit, can be formed.

Further, in the above-described method of producing a circuit board, it is preferred that the circuit pattern-forming step be a step of forming a circuit pattern portion by laser processing because a finer circuit can be formed with high accuracy. Another advantage is that by changing the laser power of the like, it is possible to adjust easily the cutting depth or the like and therefore adjust easily the depth of the circuit groove or the like that will be formed. Further, by using laser processing, it possible to form through holes used for interlayer connection or embed capacitors in the insulative substrate.

Further, in the above-described method of producing a circuit board, it is preferred that the circuit pattern-forming step be a step of forming a circuit pattern portion by using an embossing method because circuit pattern portions can be easily formed by mold stamping.

Further, in the above-described method of producing a circuit board, it is preferred that a through hole be formed in the insulative substrate during circuit pattern portion formation in the circuit pattern-forming step. With such a manufacturing method, a through hole that can be used for a via hole or an inner via hole can be formed when forming the circuit pattern portion. Further, by electroless plating the through hole thus formed, it is possible to form a via hole or an inner via hole.

Further, in the above-described method of producing a circuit board, it is preferred that the insulative substrate has a stepwise surface formed in a stepwise shape, and the insulative substrate surface be the stepwise surface. Thus, it is preferred that the insulative substrate have a stepwise surface formed in a stepwise shape, and that the aforementioned film-forming step, circuit pattern-forming step, catalyst-depositing step, film-separating step, and plating step be implemented on the stepwise surface. With such a manufacturing method, a circuit that covers the stepwise configuration can be easily formed.

Further, in the above-described method of producing a circuit board, it is preferred that the resin film include a fluorescent substance, and the method further include an inspection step of inspecting film-separating failure by monitoring light emission from the fluorescent substance after the film-separating step. In the manufacturing method such as described hereinabove, when the line width and line spacing is extremely small, the resin film that should have originally be separated can be separated incompletely and can remain in a very small amount between the adjacent circuit pattern portions. Further, pieces of the resin film that have been separated during the formation of the circuit pattern portions can penetrate into and remain in the formed circuit pattern portions. When the resin film remains between the circuit pattern portions, the electroless plating film is formed in this portion causing migration or short circuiting. When pieces of the resin film remain in the circuit pattern portion that has been formed, these pieces degrade heat resistance of the electric circuit and cause transmission loss. In such a case, it is possible to introduce a fluorescent substance into the resin film, as described hereinabove, irradiate the surface from which the film has been separated after the film-separating step with a predetermined light source, and cause light emission from the fluorescent substance only in the portions where the resin film remains. As a result, it is possible to inspect whether the film-separating failure is present and determine the location of film-separating failure.

Another aspect of the present invention resides in a circuit board obtained by the aforementioned method of producing a circuit board. With such a configuration, it is possible to obtain a circuit board in which a high-precision electric circuit is formed on the insulative substrate.

INDUSTRIAL APPLICABILITY

In accordance with the present invention, a method of producing a circuit board can be provided that makes it possible to form easily on an insulative substrate a high-precision electric circuit in which the contour of the electric circuit formed by an electroless plating film can be maintained with high accuracy. As a result it is possible to provide a method of producing a circuit board in which pieces of the unnecessary electroless plating film can be prevented from remaining in portions other than the circuit formation portions, thereby making it possible to inhibit the occurrence of short circuiting and migration.

The invention claimed is:

1. A method of producing a circuit board, comprising:
   a film-forming step of forming a resin film on a surface of an insulative substrate;
   a circuit pattern-forming step of forming a circuit pattern portion by forming a recessed portion having a depth equal to or greater than a thickness of the resin film, with an outer surface of the resin film serving as a reference;
   a catalyst-depositing step of depositing a plating catalyst or a precursor thereof on a surface of the circuit pattern portion and a surface of the resin film;
   a film-separating step of removing the resin film from the insulative substrate; and
   a plating step of forming an electroless plating film only in a region where the plating catalyst or the precursor thereof remains after the resin film is separated.

2. The method of producing a circuit board according to claim 1, wherein the film-separating step is a step of peeling off the resin film from the insulative substrate after the resin film is swelled with a predetermined liquid or part of the resin film is dissolved with a predetermined liquid.

3. The method of producing a circuit board according to claim 2, wherein a swelling degree of the resin film with respect to the liquid is equal to or greater than 50%.

4. The method of producing a circuit board according to claim 2, wherein
   the catalyst-depositing step includes a step of performing treatment in an acidic catalyst metal colloidal solution,
   the predetermined liquid in the film-separating step is an alkaline solution, and
   the resin film has a swelling degree with respect to the acidic catalyst metal colloidal solution of less than 50% and a swelling degree with respect to the alkaline solution of equal to or greater than 50%.

5. The method of producing a circuit board according to claim 1, wherein
   the film-separating step is a step of dissolving the resin film with a predetermined liquid and removing the resin film.

6. The method of producing a circuit board according to claim 1, wherein the resin film is formed by coating a suspension or an emulsion of an elastomer on the insulative substrate surface and then performing drying.

7. The method of producing a circuit board according to claim 1, wherein the resin film is formed by transferring a resin film formed on a support substrate onto the surface of the insulative substrate.

8. The method of producing a circuit board according to claim 6, wherein the elastomer is selected from the group consisting of a diene elastomer, an acrylic elastomer, and a polyester elastomer that include a carboxyl group.

9. The method of producing a circuit board according to claim 8, wherein the diene elastomer is a styrene-butadiene copolymer.

10. The method of producing a circuit board according to claim 1, wherein the resin film has, as a main component, a resin composed of an acrylic resin having 100 to 800 carboxyl groups.

11. The method of producing a circuit board according to claim 1, wherein the resin film comprises a polymer resin or a resin composition including the polymer resin, the polymer resin being obtained by polymerizing (a) at least one type of monomer of a carboxylic acid having at least one polymerizable unsaturated group in a molecule, or an anhydride thereof, and (b) at least one type of monomer that can be polymerized with the monomer (a).

12. The method of producing a circuit board according to claim 11, wherein an acid equivalent of the polymer resin is 100 to 800.

13. The method of producing a circuit board according to claim 1, wherein a thickness of the resin film is equal to or less than 10 μm.

14. The method of producing a circuit board according to claim 1, having a portion where a width of the circuit pattern portion is equal to or less than 20 μm.

15. The method of producing a circuit board according to claim 1, wherein the circuit pattern-forming step is a step of forming a circuit pattern portion by laser processing.

16. The method of producing a circuit board according to claim 1, wherein the circuit pattern-forming step is a step of forming a circuit pattern portion by using an embossing method.

17. The method of producing a circuit board according to claim 1, wherein a through hole is formed in the insulative substrate during circuit pattern portion formation in the circuit pattern-forming step.

18. The method of producing a circuit board according to claim 1, wherein the insulative substrate has a stepwise surface formed in a stepwise shape, and the insulative substrate surface is the stepwise surface.

19. The method of producing a circuit board according to claim 1, wherein
   the resin film includes a fluorescent substance, and
   the method further comprises an inspection step of inspecting film-separating failure by monitoring light emission from the fluorescent substance after the film-separating step.

20. A circuit board obtained by the method of producing a circuit board according to claim 1.

* * * * *